US006774691B2

(12) United States Patent
Han et al.

(10) Patent No.: US 6,774,691 B2
(45) Date of Patent: Aug. 10, 2004

(54) HIGH RESOLUTION INTERLEAVED DELAY CHAIN

(75) Inventors: Jonghee Han, Cary, NC (US); Jung Pill Kim, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/337,606

(22) Filed: Jan. 7, 2003

(65) Prior Publication Data

US 2004/0130365 A1 Jul. 8, 2004

(51) Int. Cl.⁷ .................................................. H03L 7/06
(52) U.S. Cl. ...................................................... 327/158
(58) Field of Search ................................. 327/149–150, 327/152, 158–159, 161, 261–263, 276–278, 284, 291–294, 299, 153, 163, 270, 271

(56) References Cited

U.S. PATENT DOCUMENTS

| | | | | |
|---|---|---|---|---|
| 5,463,337 A | | 10/1995 | Leonowich | 327/158 |
| 5,777,501 A | * | 7/1998 | AbouSeido | 327/274 |
| 5,880,612 A | | 3/1999 | Kim | 327/158 |
| 5,945,862 A | * | 8/1999 | Donnelly et al. | 327/278 |
| 6,008,680 A | | 12/1999 | Kyles et al. | 327/277 |
| 6,100,735 A | | 8/2000 | Lu | 327/158 |
| 6,218,877 B1 | | 4/2001 | Oyama et al. | 327/158 |
| 6,229,368 B1 | * | 5/2001 | Lee | 327/292 |
| 6,285,225 B1 | | 9/2001 | Chu et al. | 327/158 |
| 6,326,826 B1 | | 12/2001 | Lee et al. | 327/161 |
| 6,377,092 B2 | | 4/2002 | Ikeda | 327/158 |
| 6,392,458 B1 | | 5/2002 | Miller, Jr. et al. | 327/158 |
| 6,396,322 B1 | | 5/2002 | Kim et al. | 327/158 |
| 6,469,555 B1 | | 10/2002 | Lau et al. | 327/158 |
| 6,483,364 B2 | * | 11/2002 | Choi et al. | 327/295 |
| 6,593,773 B2 | * | 7/2003 | Staszewski et al. | 326/46 |

* cited by examiner

*Primary Examiner*—My-Trang Nuton
(74) *Attorney, Agent, or Firm*—Darby & Darby

(57) ABSTRACT

An improved delay chain for use in a delay locked loop which provides smooth phase adjustment and high resolution. In a delay chain having a series of cascaded unit delay elements, the outputs of a pair of contiguous delay elements (N, N+1) are selected for input to a phase blender. A coarse delay adjustment is carried out by selecting the outputs of the next pair of contiguous delay elements (N+1, N+2) and thus affects only one of the phase blender inputs. The phase blender provides a fine delay adjustment by generating an output whose phase is a weighted combination of the inputs, the weights having an inverse relationship. A coarse delay adjustment which affects an input of the phase blender is carried out when the weighting of that input is zero. Fine-to-coarse hand-over problems which characterize known delay locked loops are thus avoided.

12 Claims, 5 Drawing Sheets

HIGH RESOLUTION INTERLEAVED DELAY CHAIN

FIELD OF THE INVENTION

The present invention relates to delay locked loop (DLL) circuits, particularly to delay chains for use in DLL circuits.

BACKGROUND OF THE INVENTION

High speed electronic systems often have critical timing requirements which call for a periodic clock signal having a precise timing relationship with some reference signal. The improved performance of integrated circuits (ICs) and their ever-increasing complexity presents a challenge with respect to keeping such ICs synchronized when inter-operating in ever more complex systems.

The operation of all components in a system should be highly synchronized, i.e., the maximum skew or difference in time between the significant edges of the internal clocking signals of all the components should be minimal. Because different components may have different manufacturing parameters, which when taken together with additional factors such as ambient temperature, voltage, and processing variations could lead to large differences in the phases of the internal clocking signals of the different components, simply feeding a system-wide reference clock to the components may not be sufficient to achieve synchronization.

One way synchronization has been achieved is with the use of delay locked loop (DLL) circuits. FIG. 1 is a block diagram of a typical DLL circuit. The DLL includes a phase detector 10 which detects the phase difference between an input clock signal and an output clock signal of the same frequency and generates a digital signal related to the phase difference. The phase difference signal is in turn used by a delay control block 20 to control a delay chain 30 which accordingly advances or delays the timing of the output clock signal with respect to the input clock signal until the rising edge of the output clock signal is coincident with the rising edge of the input clock signal. The phase detector 10, control block 20 and delay chain 30 thus operate in a closed loop to bring the two clock signals into phase and thus synchronize the components whose operations are timed in accordance with the respective clock signals.

Optionally, a feedback delay 40 may be included in the feedback path from the output of the delay chain 30 to the phase detector 10. The feedback delay 40 can be used to compensate for additional delay to which the output clock may be subjected so that the further delayed output clock will be in phase with the input clock.

The precision with which a DLL circuit can match the phases of two clock signals depends in large part on the resolution of the delay chain used in the DLL. The resolution of the delay chain refers to the size of the delay increments by which an input signal can be delayed. The smaller the delay increments, the finer the resolution of the delay chain. Generally, however, the finer the resolution of the delay chain, the greater its complexity. Furthermore, the delay chain represents the bulk of the complexity of the DLL circuit. It is therefore desirable to achieve fine resolution without unduly increasing the complexity of the delay chain.

FIG. 2 shows a typical delay chain 30 comprising multiple delay elements 120, each of which introduces the same delay period $\tau$. A clock signal is applied to an input buffer 100 whose output is coupled to the input of a first delay element 120.1 whose output is in turn coupled to the input of a further delay element 120.2 and so on. The output of the input buffer 100 and of each delay element 120.1–120.N is coupled to a respective switch $PS_0$–$PS_N$. The output of the last delay element 120.N+1 is not used. The last delay element 120.N+1 is provided to make the load experienced by the second-to-last delay element 120.N similar to that experienced by the other delay elements, thus providing a similar response. The outputs of the switches $PS_0$–$PS_N$ are coupled to the input of an output buffer 101. The delay control logic 20 causes only one of the switches to close at any time thus selecting one of the outputs of the delay elements 120 or input buffer 100 for application to the output buffer 101.

The output of the output buffer 101 is coupled to the input of a further delay element 121 and to a first input of a phase blender 103. The output of the delay element 121 is coupled to a second input of the phase blender 103. The delay $\tau$ introduced by the delay element 121 is the same as that of each of the delay elements 120. The phase blender 103 generates a signal, DLL_clock, which is delayed (in addition to a nominal propagation delay) by a portion of the delay $\tau$ between the two inputs of the phase blender. The portion of the delay $\tau$ by which the output signal is delayed is selected in accordance with a phase blending control signal which is generated by the delay control logic 20.

The phase blender 103 can be said to provide a fine adjustment of the delay through the delay chain whereas the multiple delay elements 120 provide a coarse adjustment.

When increasing the delay through the delay chain up to the desired amount, the delay control logic 20 first adjusts the delay through the phase blender 103. If the maximum delay through the phase blender 103 is not sufficient, however, the control logic controls the switches $PS_0$–$PS_N$ to add an additional increment of delay, $\tau$, and resets the delay through the phase blender. The delay through the phase blender is then adjusted as before and the switches $PS_0$–$PS_N$ may be adjusted, as needed. The process is repeated until the delay chain 30 is configured to introduce the desired amount of delay between the input and output signals.

In order to avoid a sudden jump in the phase of the output signal, the transition in the aforementioned iterative process between the fine and coarse adjustment of the delay through the delay chain, referred to as "fine-to-coarse hand-over," should be performed so that the addition of the incremental delay $\tau$ via the delay elements 120 occurs substantially simultaneously with the resetting of the delay through the phase blender 103. If a phase jump does occur, however, it will be no larger than $\tau$, the incremental delay amount. At low clock frequencies, any such phase jump introduced by the DLL may not be significant as it represents a small percentage of the clock period. For high frequencies, however, such a phase jump can be intolerable. The presence of such a phase jump, therefore, limits the range of clock frequencies over which a DLL can operate.

One solution is to provide a delay chain having a very high resolution (small $\tau$) so that any phase jump that may occur will be negligible relative to the clock period. This approach, however, adds significantly to the complexity of the delay chain or alternatively reduces the maximum attainable delay of the delay chain and thus the operating range of the DLL.

SUMMARY OF THE INVENTION

The present invention overcomes the above-discussed problems of conventional DLLs by providing a high resolution delay chain that addresses the issue of fine-to-coarse hand-over. The delay chain of the present invention can perform a smooth fine-to-coarse hand-over with no undesirable phase discontinuity.

In an exemplary embodiment of a delay chain of the present invention, a plurality of delay elements are arranged in series. A first delayed clock signal is generated by selecting one of the outputs of a first subset of the plurality of delay elements while a second delayed clock signal is generated by selecting one of the outputs of a second subset of the plurality of delay elements. Numbering the delay elements sequentially in the order in which they are connected, the first subset of delay elements consists of the odd numbered delay elements whereas the second subset of delay elements consists of the even numbered delay elements. The outputs of the delay elements are selected so that when the output of delay element N is selected, the output of delay element N+1 is also selected. The first and second delayed clock signals will thus be offset by a unit delay period ($\tau$). At any time, the outputs of one pair of delay elements (N, N+1) will be selected as the first and second delayed clock signals.

The two delayed clock signals are coupled to the inputs of a phase blender which generates an output signal whose phase can be adjusted to vary between the phases of the two delayed clock signals (in addition to the propagation delay introduced by the phase blender itself).

When performing a fine-to-coarse hand-over, the delay chain of the present invention selects the outputs of the next pair of delay elements in the chain without resetting the phase blender. Delay can then be finely added with the phase blender by increasing the weighting of the later delayed clock signal (while reducing the weighting of the earlier delayed clock signal). The delay chain of the present invention can thus perform a smooth fine-to-coarse hand-over without the undesirable phase jump to which known delay chains are susceptible.

BRIEF DESCRIPTION OF THE DRAWINGS

The foregoing and other features of the present invention will be more readily apparent from the following detailed description and drawings of illustrative embodiments of the invention, in which.

DETAILED DESCRIPTION

Figure 3:
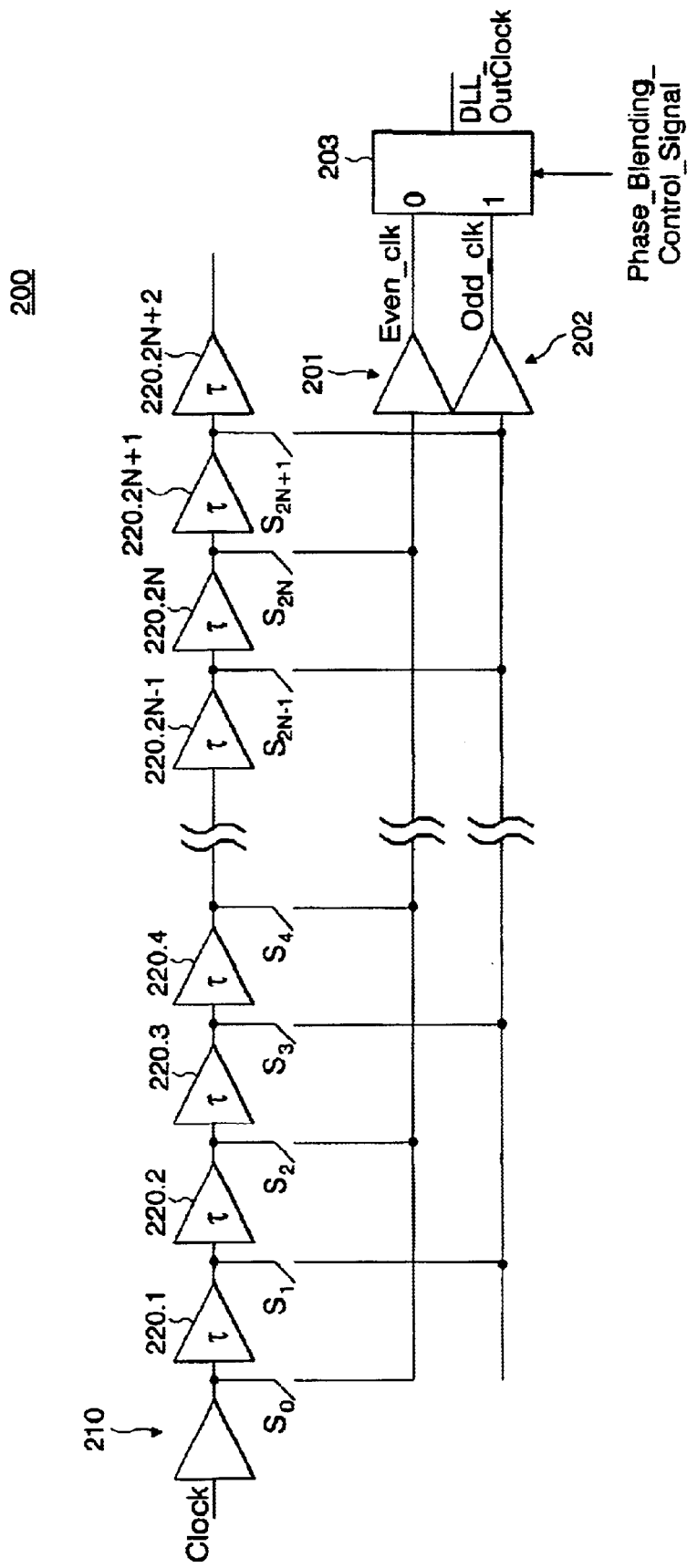
FIG. 3 shows an exemplary embodiment of a delay chain in accordance with the present invention.

FIG. 3 is a block diagram of an exemplary embodiment of a delay chain 200 in accordance with the present invention. The delay chain 200 comprises a plurality of delay elements 220, each of which delays its output relative to its input by a unit delay of $\tau$. The delay elements are coupled in series, with the input of the first delay element 220.1 being coupled to the output of an input buffer 210. An input clock signal applied to the input of the input buffer 210 is thus incrementally delayed by each of the plurality of delay elements 220. The number of delay elements and the delay introduced by each will depend on the application to which the DLL is adapted.

The output of the input buffer 210 and the output of each delay element 220 is coupled to a first side of a respective switch, designated $S_0$ through $S_{(2N+1)}$. The even-numbered switches, $S_0$, $S_2$, . . . $S_{2N}$ are coupled respectively to the output of the input buffer 210, the output of the second delay buffer 220.2, and the outputs of the remaining even-numbered delay elements. Similarly, the odd-numbered switches $S_1$, $S_3$, . . . $S_{2N+1}$ are coupled to the outputs of the odd-numbered delay elements (220.1, 220.3, . . . 220.(2N+1)). The outputs of the even-numbered switches are coupled to the input of a buffer 201, while the outputs of the odd-numbered switches are coupled to the input of a buffer 202. The switches $S_0$–$S_{2N+1}$ are part of a switching network which can be implemented in a variety of ways, as understood by a person of ordinary skill in the art. For example, such a switching network can be implemented with logic gates arranged in a multiplexer configuration. Switches are shown for simplicity.

The last delay element 220.2N+2 is used to make the load experienced by the second-to-last delay element 220.2N+1 similar to that experienced by the other delay elements, thus providing a similar response. The output of the last delay element 220.2N+2 is not used.

At any one time, only one even-numbered switch and one odd-numbered switch is closed. Moreover, the two switches that are closed are adjacent to each other. Thus, for example the following pairs of switches can be closed at any one time: $(S_0, S_1)$, $(S_1, S_2)$, $(S_2, S_3)$ . . . $(S_{2N-1}, S_{2N})$ and $(S_{2N}, S_{2N+1})$. As such, the signal Even_clk that is generated at the output of the buffer 201 is a version of the input clock that has been delayed by an even multiple of $\tau$, the unit delay, whereas the signal Odd_clk that is generated at the output of the buffer 202 is a version of the input clock that has been delayed by an odd multiple of $\tau$. Furthermore, the signals Even_clk and Odd_clk are staggered by one unit delay period $\tau$. Depending on which switch pair is closed, Even_clk may lead Odd_clk or Odd_clk may lead Even_clk (by the unit delay period $\tau$). For example, if $S_2$ and $S_3$ are closed, Even_clk will lead, whereas if $S_3$ and $S_4$ are closed, Odd_clk will lead.

The signals Even_clk and Odd_clk are provided to inputs of a phase blender 203. The phase blender 203 generates an output signal DLL_Outclock whose phase is a variable combination of the phases of the inputs Even_clk and Odd_clk. For example, the phase of the output of the phase blender can be a weighted sum of the phases of the inputs, where the respective weights of the phases of the inputs are complementary (e.g., the sum of the weights is constant) and are determined by a control signal input to the phase blender (Phase_Blending_Control_Signal). The operation of an exemplary embodiment of the phase blender 203 can be expressed as follows:
where:
  Pout=phase of the output signal
  P0=phase of the signal at input 0
  P1=phase of the signal at input 1
  W0=weight applied to the phase of the signal at input 0
  W1=weight applied to the phase of the signal at input 1
  $0 \leq W0 \leq 1$
  $0 \leq W1 \leq 1$
  W0+W1=1
  Pout=W0*P0+W1*P1

It should be noted, however, that the phase blender also introduces propagation delay and that the phase of the output signal will reflect this delay.

Figure 4:
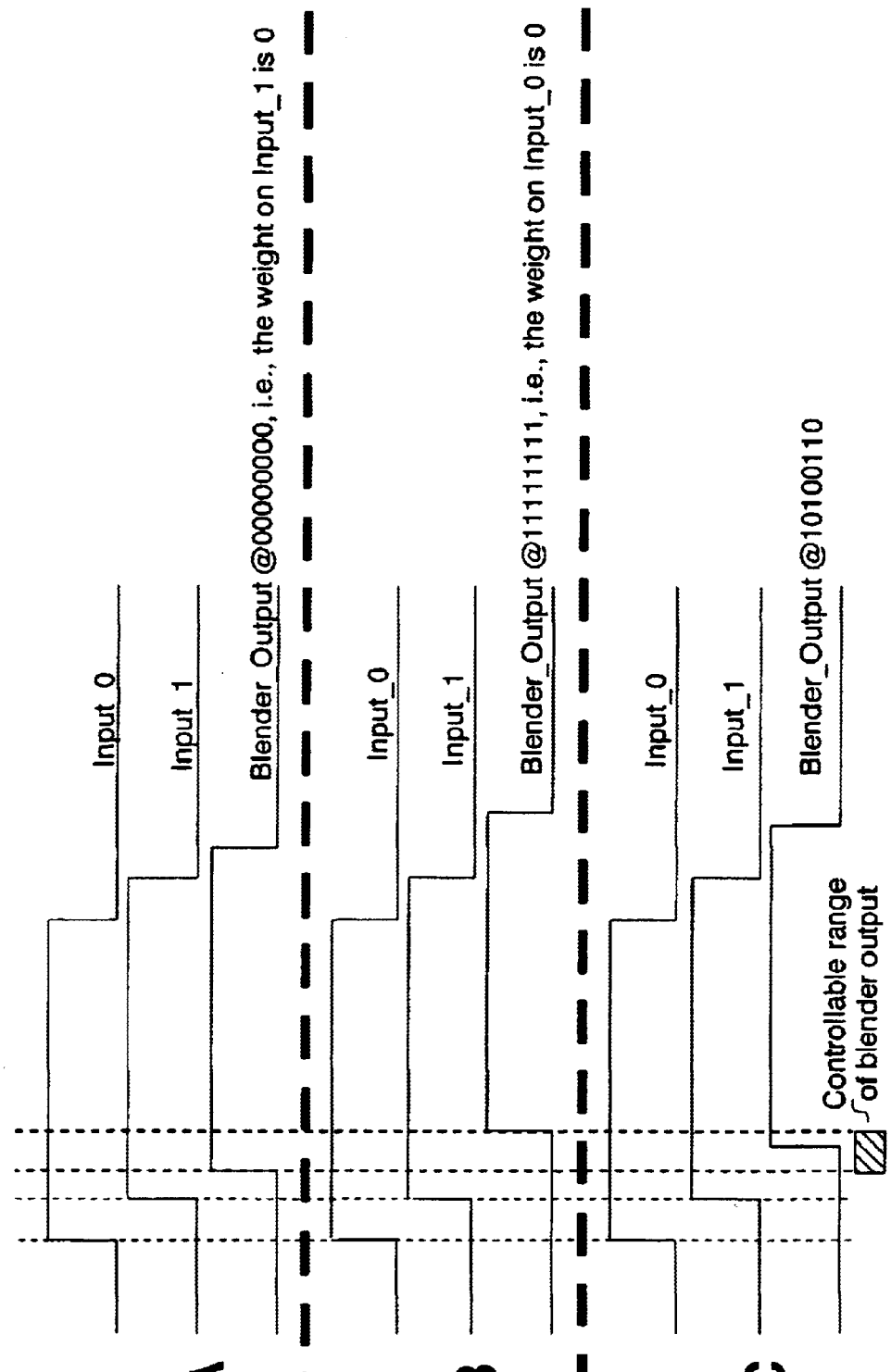
FIGS. 4A through 4C show timing diagrams illustrating the operation of an exemplary phase blender useful in the delay chain of FIG. 3.

The operation of an exemplary phase blender is illustrated in FIGS. 4A–4C. In this embodiment, the blending control signal has an 8-bit value that can vary between 00000000 (00h) and 11111111 (FFh) thus providing 256 discrete steps of adjustment. At one extreme, in which the blending control signal has a value of 00h, the phase of the output signal is determined entirely by input 0 (i.e., the weight for input 0 is 1.0) and not at all by input 1 (i.e., the weight for input 1 is 0.0). This condition is illustrated in FIG. 4A. When the phase blending control signal is at the other extreme, FFh, the phase of the output signal is determined entirely by input 1 (i.e., the weight for input 1 is 1.0) and not at all by input 0 (i.e., the weight for input 0 is 0.0). This is illustrated in FIG. 4B. FIG. 4C illustrates an intermediate case in which the blending control signal is between the two extreme values.

The controllable range of the phase of the blender output is preferably substantially the same as the phase difference between the two input signals, which in this case is the unit delay period $\tau$. Note also, as mentioned above, that in addition to being delayed through the phase blender by some portion of the unit delay period $\tau$, the output signal is also delayed by some nominal propagation delay which is preferably substantially constant for all values of the blending control signal.

The switches and the phase blender are under the control of a delay control block as a function of a phase difference signal generated by a phase detector. In light of the description provided herein, the specifics of these blocks are within the understanding of a person of ordinary skill in the art and thus need not be described in greater detail. Furthermore, the delay elements, buffers, switches and phase blender can be implemented using any of a variety of well-known techniques. Moreover, the individual switches can be replaced by functionally equivalent structures, such as a multiplexer or the like.

Figure 1:
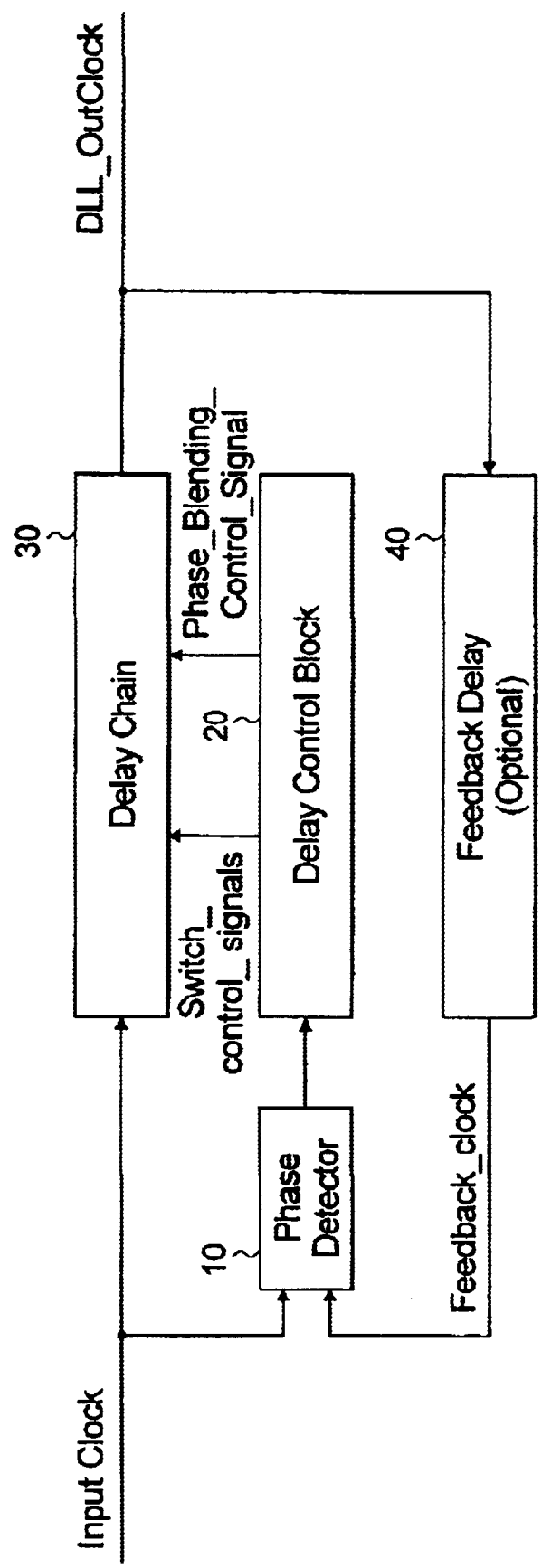
FIG. 1 is a block diagram of an exemplary digital delay locked loop (DLL)
Figure 2:
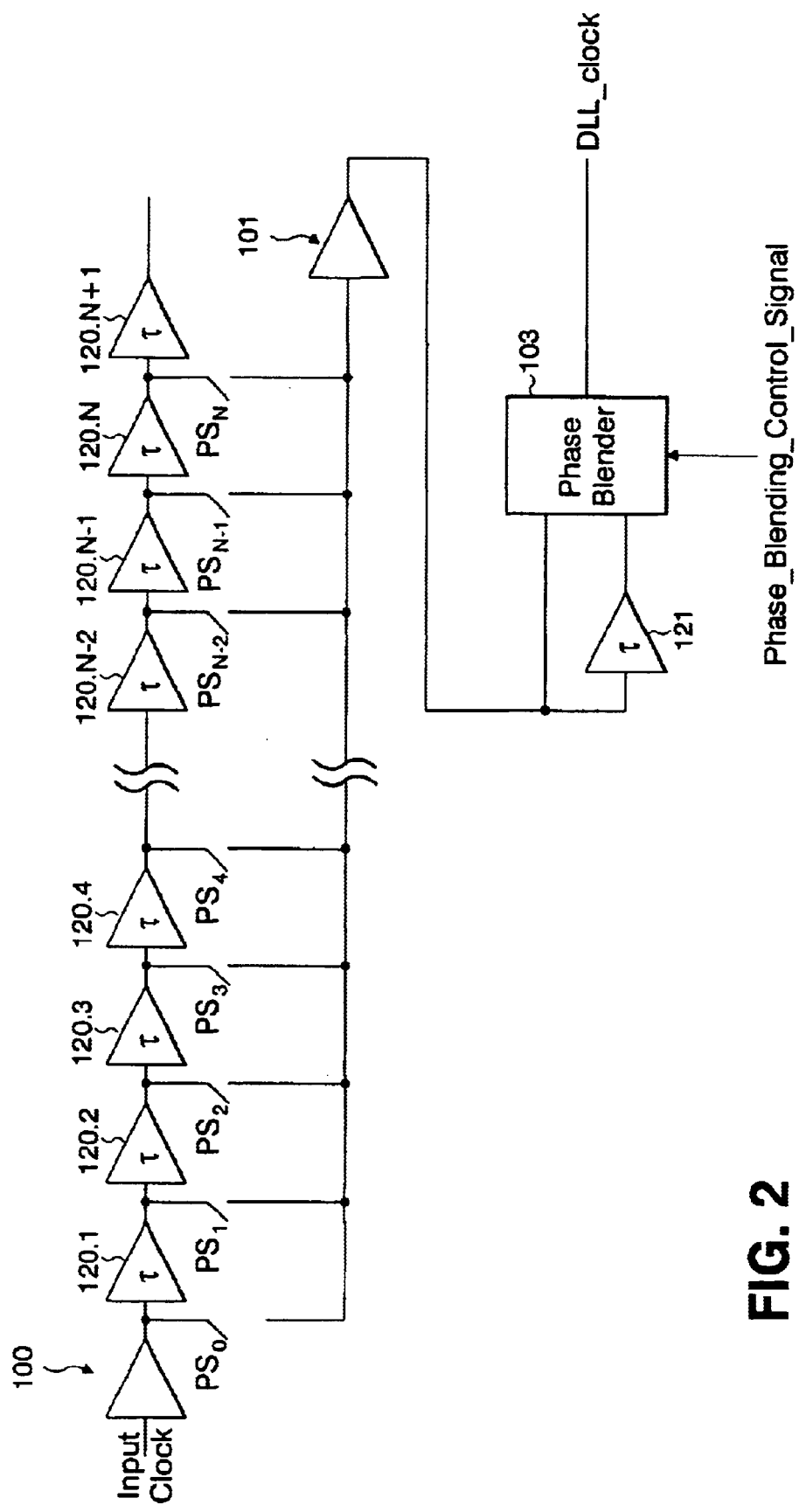
FIG. 2 shows a conventional delay chain for use in a DLL.

The operation of the exemplary delay chain 200 within a DLL will now be described. As discussed above in connection with FIG. 1, the delay chain 200 is controlled by the delay control block 20 to delay an input clock signal by a variable amount of time. The variable amount of delay introduced by the delay chain 200 comprises, in general, a "coarse" component, which is an integer multiple of the unit delay period $\tau$, as determined by the states of the switches $S_0$–$S_{2N+1}$, in addition to a "fine" component, which is a fractional portion of the unit delay period $\tau$, as determined by the phase control input to the phase blender 203. As will be understood by a person of ordinary skill in the art, the overall delay introduced by the delay chain also includes a substantially fixed component which is attributable to propagation delays through various components of the delay chain. For purposes of the present discussion, this fixed component can be ignored.

In an initial state in which the output clock and the input clock are out of phase, the variable delay through the delay chain 200 is at some initial value, e.g., 0. As can be understood by one of ordinary skill in the art, the delay control can configure the delay chain 200 to start with a non-zero delay value, which can be a function of the value of the phase difference detected by the phase detector 10. The case of a zero variable delay initial condition is merely illustrative and is used for simplicity.

In this initial state, switches $S_0$ and $S_1$ are closed and the Phase_Blending_Control_Signal has a zero value. The delay control block 20 then incrementally increases the delay through the phase blender 203 by increasing the value of the phase blending control signal. This is the fine portion of the delay adjustment procedure. If the phase blending control signal reaches the maximum value (FFh) and there is still an undesired phase difference between the input and output clock signals, the delay control block 20 then configures the switches so that switches $S_1$ and $S_2$ are closed (i.e., switch $S_0$ is opened and switch $S_2$ is closed.) When switches $S_1$ and $S_2$ are closed, Even_clk will lag Odd_clk by one unit delay period $\tau$. This is the coarse portion of the delay adjustment procedure. The phase of the output clock, however, does not change until the phase blending control signal is reduced (from the maximum value, FFh). The delay control block then continues to increase the variable delay through the delay chain by decreasing the value of the phase blending control signal. If the phase blending control signal reaches the minimum value (00h) and there is still an undesired phase difference between the input and output clock signals, the delay control block 20 then configures the switches so that switches $S_2$ and $S_3$ are closed (i.e., switch $S_1$ is opened and switch $S_3$ is closed.) When $S_2$ and $S_3$ are closed, Odd_clk will lag Even_clk by one unit delay period $\tau$. The phase of the output clock, however, does not change until the phase blending control signal is increased (from the minimum value, 00h). The delay control block then continues to increase the variable delay through the delay chain by increasing the value of the phase blending control signal. This iterative procedure is carried out until the phase detector 10 detects no phase difference (or some desired predetermined phase difference) between the input and output clocks.

As can be appreciated from the above description, the present invention avoids the fine-to-coarse hand-over problems of the prior art by not changing the states of any of the switches ($S_0$–$S_{2N+1}$) at or about the same time as the phase blender. Any jump in phase caused by the coarse adjustment (i.e., change of switch states) is masked by the phase blender (i.e., the weighting of the transitioning input is zero at the time of the transition) and does not appear at the output clock signal.

Figure 5:
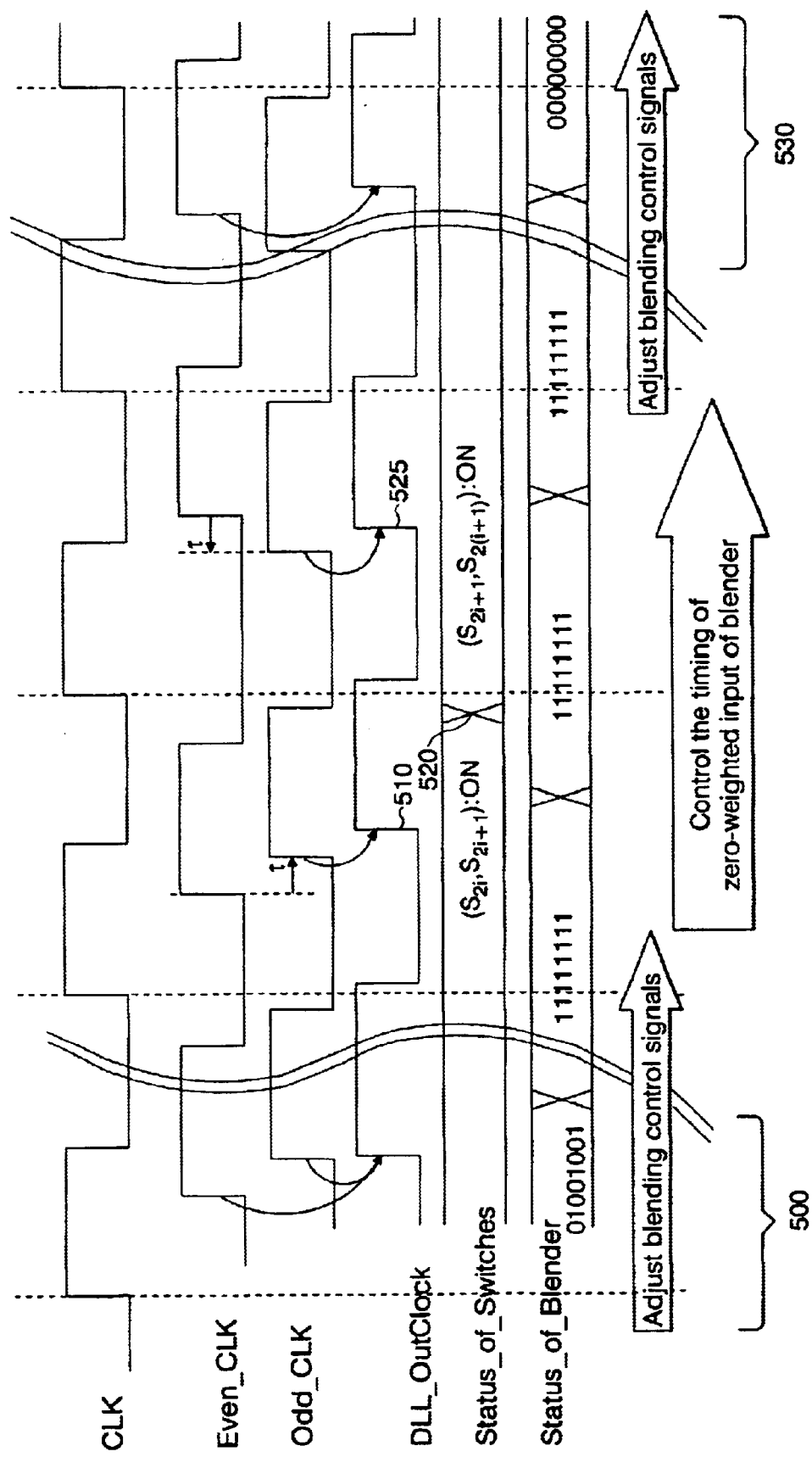
FIG. 5 shows a timing diagram illustrating the operation of an exemplary embodiment of a DLL in accordance with the present invention.

FIG. 5 shows a signal timing diagram that illustrates the above-described operation of the delay chain of the present invention. In the example illustrated in FIG. 5, the delay chain is at first in a state 500 in which Odd_clk lags Even_clk (i.e., a switch pair comprised of an even-numbered switch $S_{2N}$ and the next odd-numbered switch $S_{2N+1}$ is closed) and the phase blender introduces an intermediate delay (i.e., the phase blending control is at an intermediate value, e.g., 01001001). The delay through the phase blender is then increased until it reaches the maximum value (11111111) so that at 510, the phase of the output signal, DLL_Outclock is determined entirely by Odd_clk. The delay control block then determines that additional delay is required (i.e., the phase detector still detects a phase difference between the input and output clocks) and at 520 controls the states of the switches so that the odd-numbered switch $S_{2N+1}$ and the next even number switch $S_{2(N+1)}$ are closed. This causes Even_clk to lag Odd_clk by one unit delay period $\tau$. Note, however, that the phase of the output signal DLL_Outclock does not change because it is still determined entirely by the phase of Odd_clk (see 525). The delay through the delay chain is then increased by decrementing the phase blending control signal from the maximum value (11111111) to a lower value, as needed. FIG. 5 shows the phase blending control signal decreasing all the way down to the minimum value (00000000) at 530.

The present invention is not to be limited in scope by the specific embodiments described herein. Indeed, various modifications of the invention in addition to those described herein will become apparent to those skilled in the art from the foregoing description and the accompanying figures. Such modifications are intended to fall within the scope of the appended claims.

It is further to be understood that all values are to some degree approximate, and are provided for purposes of description.

The disclosures of any patents, patent applications, and publications that may be cited throughout this application are incorporated herein by reference in their entireties.

What is claimed is:

1. A delay chain comprising:
   a plurality of delay elements coupled in series, each delay element introducing substantially a unit delay;
   a switching network, the switching network having a plurality of inputs coupled to respective outputs of the delay elements and first and second outputs, the first output being selectively coupled to an output of one of a first subset of the plurality of delay elements, and the second output being selectively coupled to an output of one of a second subset of the plurality of delay elements, wherein the first and second subsets are interleaved; and
   a phase blender, the phase blender having a first input coupled to the first output of the switching network and a second input coupled to the second output of the switching network, wherein the phase blender generates an output signal which is a function of a variable combination of the first and second inputs.

2. The delay chain of claim 1, wherein signals at the first and second outputs of the switching network have a timing difference substantially equal to the unit delay.

3. The delay chain of claim 1, wherein the phase blender selectively varies the timing of the output signal by as much as a period of time substantially equal to the unit delay.

4. The delay chain of claim 1, wherein a phase of a signal at the first output of the switching network changes when an influence of the first input of the phase blender on the output signal is substantially zero and wherein a phase of a signal at the second output of the switching network changes when an influence of the second input of the phase blender on the output signal is substantially zero.

5. The delay chain of claim 1, wherein the variable combination of the first and second inputs is a function of a first weighting associated with the first input and a second weighting associated with the second input, the first and second weightings having an inverse relationship.

6. The delay chain of claim 1, wherein the switching network includes:
   a first set of switches, each of the first set of switches having a first side coupled to a respective output of the first subset of the plurality of delay elements and a second side coupled to the first output of the switching network; and
   a second set of switches, each of the second set of switches having a first side coupled to a respective output of the second subset of the plurality of delay elements and a second side coupled to the second output of the switching network.

7. The delay chain of claim 1, wherein the plurality of delay elements are numbered in correspondence with their respective positions in the delay chain, the first subset of the plurality of delay elements being comprised of odd numbered delay elements and the second subset of the plurality of delay elements being comprised of even numbered delay elements.

8. A delay locked loop circuit comprising a delay chain, the delay chain comprising:
   a plurality of delay elements coupled in series, each delay element introducing substantially a unit delay;
   a switching network, the switching network having a plurality of inputs coupled to respective outputs of the delay elements and first and second outputs, the first output being selectively coupled to an output of one of a first subset of the plurality of delay elements, and the second output being selectively coupled to an output of one of a second subset of the plurality of delay elements, wherein the first and second subsets are interleaved; and
   a phase blender, the phase blender having a first input coupled to the first output of the switching network and a second input coupled to the second output of the switching network, wherein the phase blender generates an output signal which is a function of a variable combination of the first and second inputs.

9. An integrated circuit comprising a delay clain, the delay chain comprising:
   a plurality of delay elements coupled in series, each delay element introducing substantially a unit delay;
   a switching network, the switching network having a plurality of inputs coupled to respective outputs of the delay elements and first and second outputs, the first output being selectively coupled to an output of one of a first subset of the plurality of delay elements, and the second output being selectively coupled to an output of one of a second subset of the plurality of delay elements, wherein the first and second subsets are interleaved; and
   a phase blender, the phase blender having a first input coupled to the first output of the switching network and a second input coupled to the second output of the switching network, wherein the phase blender generates an output signal which is a function of a variable combination of the first and second inputs.

10. A method of adjusting a signal delay comprising:
    selecting a first signal as a first intermediate signal and a second signal as a second intermediate signal, the second signal being delayed relative to the first signal substantially by a predetermined period of time;
    performing a coarse delay adjustment by selecting a third signal as the first intermediate signal, the third signal being delayed relative to the second signal substantially by the predetermined period of time; and
    performing a fine delay adjustment by varying the timing of an output signal in accordance with a variable combination of the first and second intermediate signals,
    wherein the coarse delay adjustment is performed when an influence of the first intermediate signal on the timing of the output signal is substantially zero.

11. The method of claim 10, wherein the variable combination of the first and second intermediate signals is a function of a first weighting associated with the first intermediate signal, and a second weighting associated with the second intermediate signal, the first and second weightings having an inverse relationship.

12. The method of claim 10, wherein the fine delay adjustment can vary the timing of the output signal by up to substantially the predetermined period of time.

* * * * *